United States Patent
Chun et al.

(10) Patent No.: US 9,368,649 B2
(45) Date of Patent: Jun. 14, 2016

(54) SCHOTTKY BARRIER DIODE AND METHOD OF MANUFACTURING THE SAME

(71) Applicant: Hyundai Motor Company, Seoul (KR)

(72) Inventors: Dae Hwan Chun, Gwangmyung-si (KR); Jong Seok Lee, Suwon-si (KR); Kyoung-Kook Hong, Hwaseong-si (KR); Youngkyun Jung, Seoul (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 0 days.

(21) Appl. No.: 14/095,650

(22) Filed: Dec. 3, 2013

(65) Prior Publication Data

US 2014/0167072 A1 Jun. 19, 2014

(30) Foreign Application Priority Data

Dec. 18, 2012 (KR) .................... 10-2012-0148601

(51) Int. Cl.
*H01L 31/075* (2012.01)
*H01L 29/15* (2006.01)
*H01L 29/872* (2006.01)
*H01L 29/66* (2006.01)
*H01L 29/861* (2006.01)
*H01L 29/16* (2006.01)

(52) U.S. Cl.
CPC .......... *H01L 29/872* (2013.01); *H01L 29/1608* (2013.01); *H01L 29/66143* (2013.01); *H01L 29/8611* (2013.01)

(58) Field of Classification Search
CPC .............. H01L 29/872; H01L 29/6606; H01L 29/1608; H01L 29/66143
USPC .............................. 257/77, 475; 438/572, 534
See application file for complete search history.

(56) References Cited

U.S. PATENT DOCUMENTS

| | | | |
|---|---|---|---|
| 2005/0073030 A1* | 4/2005 | Inoue et al. | 257/656 |
| 2008/0296587 A1* | 12/2008 | Yamamoto et al. | 257/77 |
| 2014/0048847 A1* | 2/2014 | Yamashita et al. | 257/140 |

FOREIGN PATENT DOCUMENTS

| | | |
|---|---|---|
| JP | 2002-314099 A | 10/2002 |
| JP | 2008-227111 A | 9/2008 |

* cited by examiner

*Primary Examiner* — Evan Pert
*Assistant Examiner* — Changhyun Yi
(74) *Attorney, Agent, or Firm* — McDermott Will & Emery LLP (57) ABSTRACT

A schottky barrier diode includes an n− type epitaxial layer disposed at a first surface of an n+ type silicon carbide substrate, a plurality of n type pillar areas disposed in the n− type epitaxial layer at a first portion of a first surface of the n+ type silicon carbide substrate, a plurality of p+ areas disposed at a surface of the n− type epitaxial layer and separated from the n type pillar area, a schottky electrode disposed on the n− type epitaxial layer and the p+ area, and an ohmic electrode disposed at a second surface of the n+ type silicon carbide substrate. A doping density of the n type pillar area is larger than a doping density of the n− type epitaxial layer.

3 Claims, 10 Drawing Sheets

SCHOTTKY BARRIER DIODE AND METHOD OF MANUFACTURING THE SAME

CROSS-REFERENCE TO RELATED APPLICATION

This application claims benefit of priority to Korean Patent Application No. 10-2012-0148601 filed in the Korean Intellectual Property Office on Dec. 18, 2012, the entire contents of which are incorporated herein by reference.

TECHNICAL FIELD

The present inventive concept relates to a schottky barrier diode including silicon carbide (SiC) and a method of manufacturing the same.

BACKGROUND

A schottky barrier diode (SBD) does not use a PN junction. Unlike a general PN diode, the SBD uses a schottky junction in which a metal and a semiconductor are bonded, represents fast switching characteristics, and has turn-on voltage characteristics lower than that of a PN diode.

In a general SBD, in order to improve reduction characteristics of a leakage current, a leakage current is intercepted and a breakdown voltage is improved by applying a structure of a junction barrier schottky (JBS) in which a p+ area is formed in a lower end portion of a schottky junction portion, and by overlapping of a PN diode depletion layer that is diffused when an inverse voltage is applied.

However, as a p+ area exists in the schottky junction portion, a contact area between an n− epitaxial layer or an n− drift layer and a schottky electrode as a current path of a forward direction decreases. Thus, there is a problem that a resistance value increases and on-resistance of the SBD increases.

The above information disclosed in this Background section is only for enhancement of understanding of the background of the inventive concept and therefore it may contain information that does not form the prior art.

SUMMARY

The present inventive concept has been made in an effort to provide a schottky barrier diode and a method of manufacturing the same having advantages of lowering on-resistance of the schottky barrier diode when a forward direction voltage is applied in the schottky barrier diode.

An aspect of the present inventive concept relates to a schottky barrier diode including an n− type epitaxial layer disposed at a first surface of an n+ type silicon carbide substrate, a plurality of n− type pillar areas disposed in the n− type epitaxial layer at a first portion of a first surface of the n+ type silicon carbide substrate, a plurality of p+ areas disposed at a surface of the n− type epitaxial layer and separated from the n type pillar area, a schottky electrode disposed on the n− type epitaxial layer and the p+ area; and an ohmic electrode disposed at a second surface of the n+ type silicon carbide substrate. A doping density of the n type pillar area is larger than a doping density of the n− type epitaxial layer.

The p+ area may be disposed at a portion corresponding to a second portion of the first surface of the n+ type silicon carbide substrate adjacent to the first portion of the first surface of the n+ type silicon carbide substrate.

The p+ area may be disposed at a corresponding portion between the n type pillar areas.

Another aspect of the present inventive concept encompasses a method of manufacturing a schottky barrier diode. According to the method, a first buffer layer pattern is formed at a first surface of an n+ type silicon carbide substrate such that a first portion of the first surface of the n+ type silicon carbide substrate is exposed. A plurality of n type pillar areas are formed by first epitaxial growth at the first portion of the first surface of the n+ type silicon carbide substrate. A second portion of the first surface of the n+ type silicon carbide substrate adjacent to the first portion of the first surface of the n+ type silicon carbide substrate is exposed by removing the first buffer layer pattern; forming a second buffer layer pattern on the n type pillar area. A preliminary n− type epitaxial layer is formed by second epitaxial growth in the second portion of the first surface of the n+ type silicon carbide substrate. The second buffer layer pattern is removed and an n− type epitaxial layer is formed by third epitaxial growth in the preliminary n− type epitaxial layer and the n type pillar area such that the formed n− type epitaxial layer includes the preliminary n− type epitaxial layer. A plurality of p+ areas is formed by injecting p+ ions at a surface of the n− type epitaxial layer. A schottky electrode is formed on the p+ area and the n− type epitaxial layer. An ohmic electrode is formed at a second surface of n+ type silicon carbide substrate. A doping density of the n type pillar area is larger than a doping density of the n− type epitaxial layer.

The n type pillar area and the first buffer layer pattern may have the same thickness.

The n type pillar area and the preliminary n− type epitaxial layer may have the same thickness.

In this way, according to an exemplary embodiment of the present inventive concept, in a schottky barrier diode, by disposing an n type pillar area having a doping concentration larger than a doping concentration of an n− type epitaxial layer at the inside of the n− type epitaxial layer, when a forward direction voltage of the schottky barrier diode is applied, on-resistance of the schottky barrier diode can be largely reduced.

BRIEF DESCRIPTION OF THE DRAWINGS

The foregoing and other features of the inventive concept will be apparent from a more particular description of embodiments of the inventive concept, as illustrated in the accompanying drawings in which like reference characters may refer to the same or similar parts throughout the different views. The drawings are not necessarily to scale, emphasis instead being placed upon illustrating the principles of the embodiments of the inventive concept.

DETAILED DESCRIPTION

Exemplary embodiments of the present inventive concept will be described in detail with reference to the accompanying drawings. The present inventive concept may be modified in many different forms and should not be construed as being limited to the exemplary embodiments set forth herein. Rather, the exemplary embodiments of the present inventive concept are provided so that this disclosure will be thorough and complete, and will fully convey the concept of the present inventive concept to those skilled in the art.

In the drawings, the thickness of layers and regions are exaggerated for clarity. When it is said that a layer is positioned on another layer or substrate, it means the layer may be directly formed on the another layer or substrate or a third layer may be interposed therebetween. Like reference numerals designate like elements throughout the specification.

Figure 1:
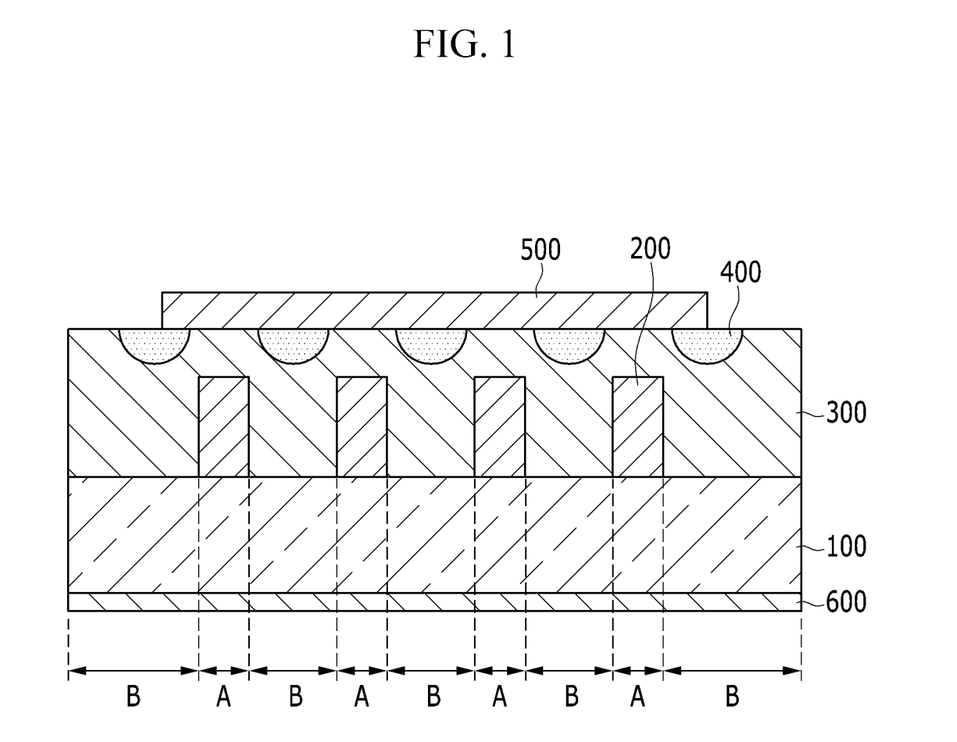
FIG. 1 is a cross-sectional view illustrating a schottky barrier diode according to an exemplary embodiment of the present inventive concept.

FIG. 1 is a cross-sectional view illustrating a schottky barrier diode according to an exemplary embodiment of the present inventive concept.

Referring to FIG. 1, in the schottky barrier diode (SBD) according to an exemplary embodiment of the present inventive concept, at a first surface of an n+ type silicon carbide substrate 100, an n− type epitaxial layer 300 may be disposed. At a surface of the n− type epitaxial layer 300, a plurality of p+ areas 400 may be disposed. On the n− type epitaxial layer 300 and the p+ area 400, a schottky electrode 500 may be disposed. At a second surface of the n+ type silicon carbide substrate 100, an ohmic electrode 600 may be disposed. The schottky electrode 500 may be in contact with the n− type epitaxial layer 300 and the p+ area 400. Further, at the first surface of the n+ type silicon carbide substrate 100 within the n− type epitaxial layer 300, a plurality of n type pillar areas 200 having a doping concentration larger than a doping concentration of the n− type epitaxial layer 300 may be disposed. The first surface of the n+ type silicon carbide substrate 100 may include a plurality of adjacent first portions A and second portions B. The n type pillar area 200 may be disposed on the first portion A of the first surface of the n+ type silicon carbide substrate 100.

The p+ area 400 may be disposed separately from the n type pillar area 200 and may be disposed at a portion corresponding to the second portion B of the first surface of the n+ type silicon carbide substrate 100. That is, the p+ area 400 may be disposed at a corresponding portion between the n type pillar areas 200.

Because a doping concentration of the n type pillar area 200 is larger than the doping concentration of the n− type epitaxial layer 300, when a forward direction voltage of the SBD is applied, most of electrons and a current may flow through the n type pillar area 200. Accordingly, when a forward direction voltage of the SBD is applied, if electrons and a current flow through the n type pillar area 200 and the n-type epitaxial layer 300, the electrons and the current may receive small resistance and thus on-resistance of the SBD may be reduced.

Further, when a backward direction voltage is applied, a depletion layer may be formed between the p+ areas 400 and thus a leakage current may be reduced.

Referring to FIGS. 1 to 7, a method of manufacturing a schottky barrier diode (SBD) according to an exemplary embodiment of the present inventive concept will be described in detail.

FIGS. 2 to 7 are cross-sectional views sequentially illustrating a method of manufacturing an SBD according to an exemplary embodiment of the present inventive concept.

Figure 2:
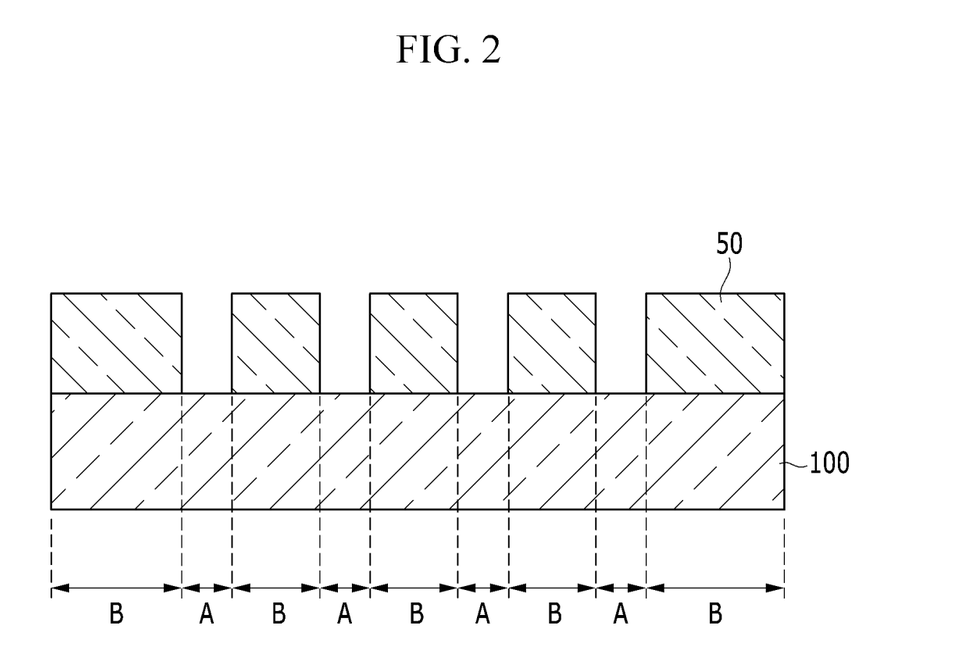
FIGS. 2 to 7 are cross-sectional views sequentially illustrating a method of manufacturing a schottky barrier diode according to an exemplary embodiment of the present inventive concept.

As shown in FIG. 2, the n+ type silicon carbide substrate 100 may be prepared. At the first surface of the n+ type silicon carbide substrate 100, a first buffer layer pattern 50 may be formed. The first buffer layer pattern 50 may expose a first portion A of the first surface of the n+ type silicon carbide substrate 100.

Figure 3:
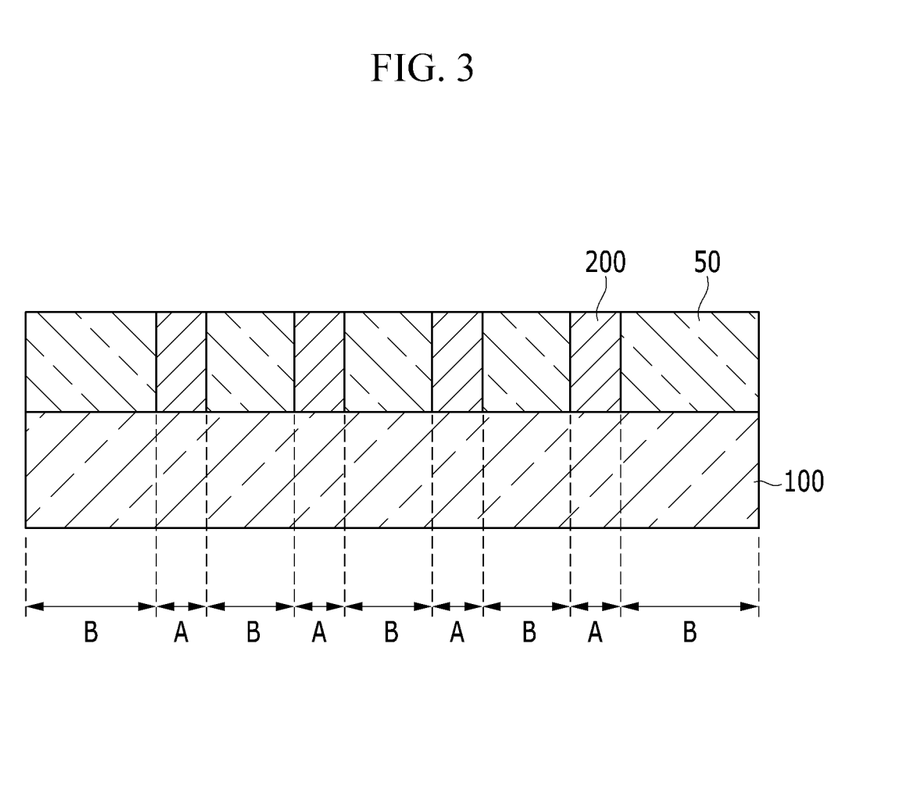

As shown in FIG. 3, the plurality of n type pillar areas 200 may be formed by first epitaxial growth in the first portion A of the first surface of the n+ type silicon carbide substrate 100. The n type pillar area 200 and the first buffer layer pattern 50 may have the same thickness.

Figure 4:
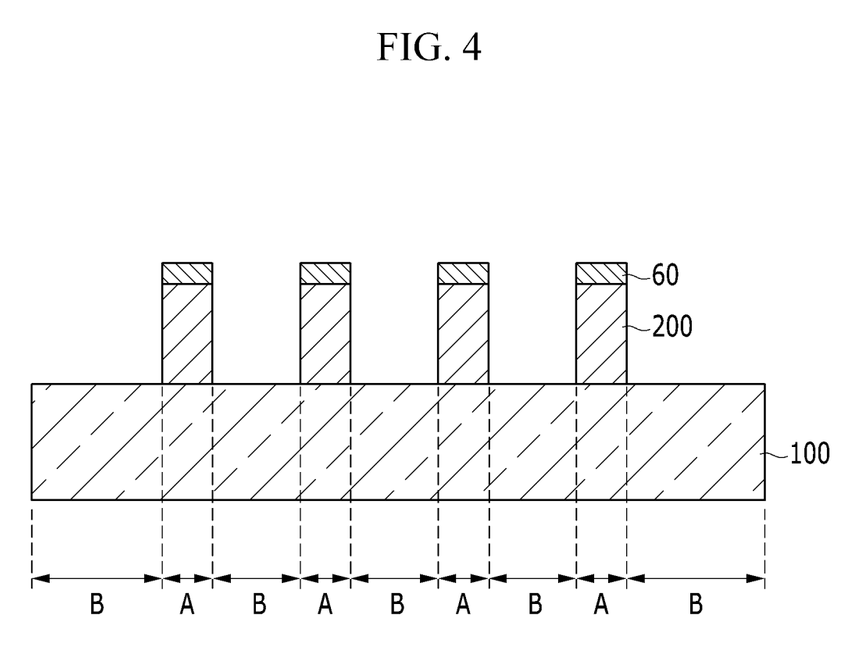

As shown in FIG. 4, by removing the first buffer pattern 50, a second portion B of the first surface of the n+ type silicon carbide substrate 100 may be exposed and a second buffer layer pattern 60 may be formed on the n type pillar area 200. The second portion B of the first surface of the n+ type silicon carbide substrate 100 may be disposed adjacent to the first portion A of the first surface of the n+ type silicon carbide substrate 100.

Figure 5:
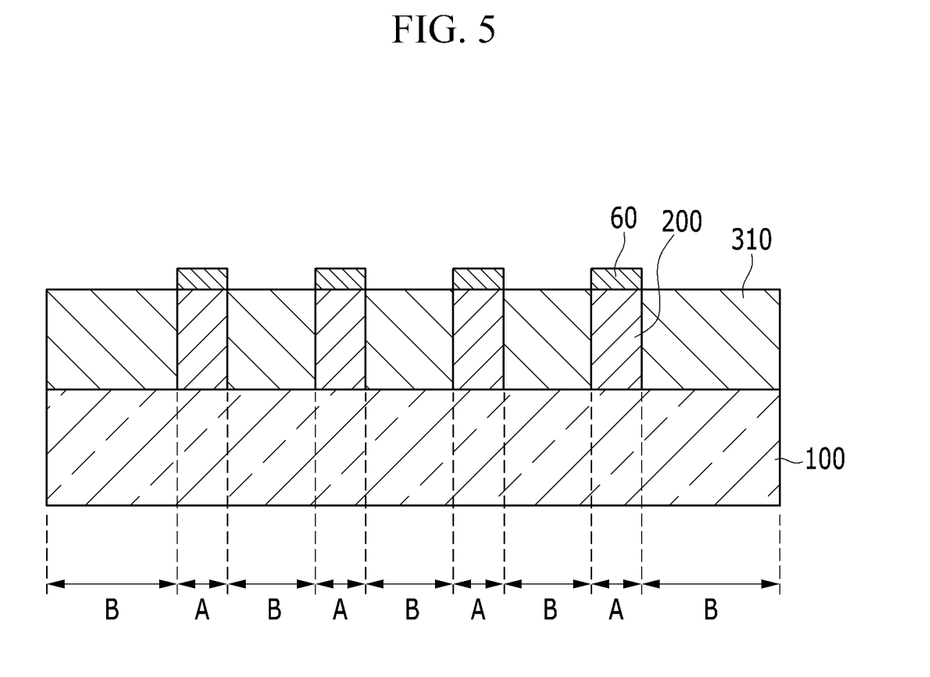

As shown in FIG. 5, in the second portion B of the first surface of the n+ type silicon carbide substrate 100, a preliminary n− type epitaxial layer 310 may be formed by the second epitaxial growth. In this case, the n type pillar area 200 may not perform the second epitaxial growth by the second buffer layer pattern 60. The preliminary n− type epitaxial layer 310 and the n type pillar area 200 may have the same thickness.

Figure 6:
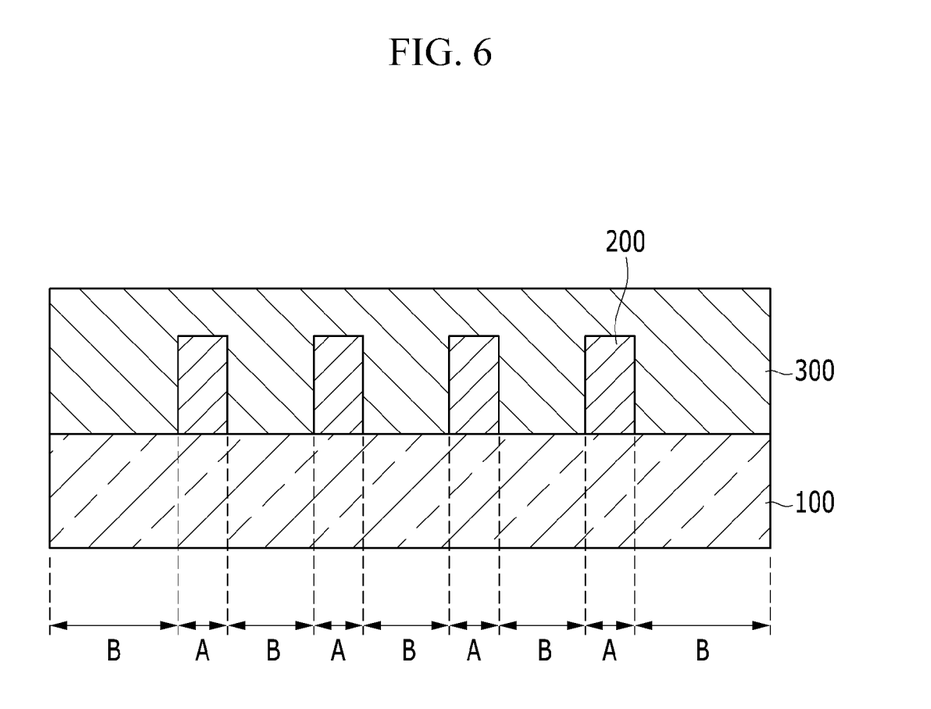

As shown in FIG. 6, the second buffer layer pattern 60 may be removed. After the second buffer layer pattern 60 is removed, the n− type epitaxial layer 300 may be formed by third epitaxial growth on the preliminary n− type epitaxial layer 310 and the n type pillar area 200, such that the formed n− type epitaxial layer 300 includes the preliminary n− type epitaxial layer 310. A doping concentration of the n− type epitaxial layer 300 may be smaller than a doping concentration of the n type pillar area 200.

Figure 7:
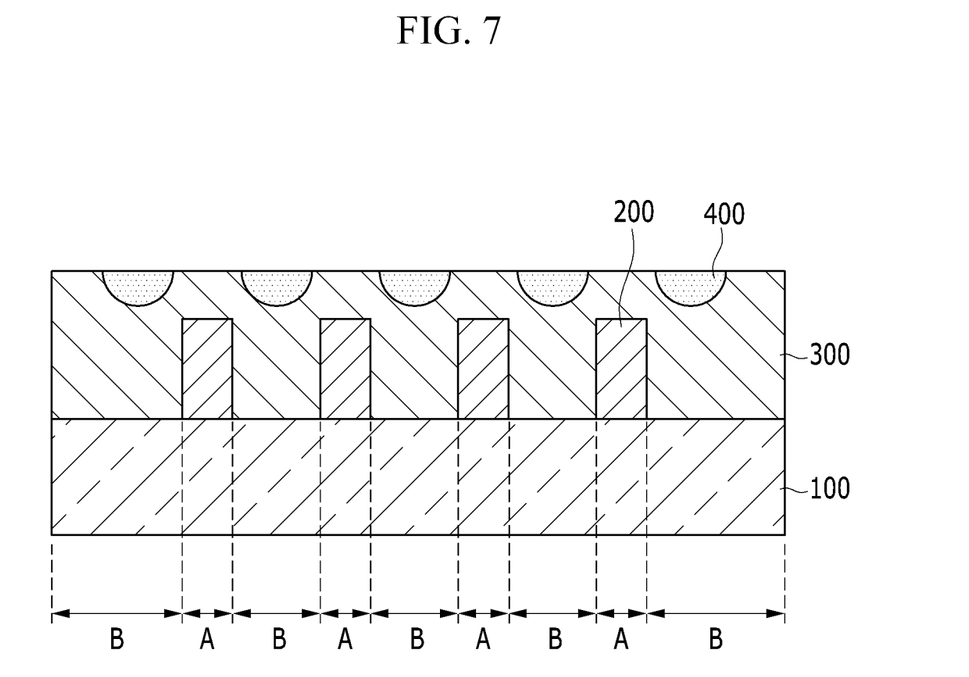

As shown in FIG. 7, by injecting p+ ions into a surface of the n− type epitaxial layer 300 at a portion corresponding to the second portion B of the first surface of the n+ type silicon carbide substrate 100, a plurality of p+ areas 400 may be formed. The p+ area 400 may be separated from the n type pillar area 200 and may be disposed at a portion corresponding to the second portion B of the first surface of the n+ type silicon carbide substrate 100. That is, the p+ area 400 may be positioned at a corresponding portion between the n type pillar areas 200.

As shown in FIG. 1, the schottky electrode 500 may be formed on the p+ area 400 and the n− type epitaxial layer 300. At the second surface of the n+ type silicon carbide substrate 100, the ohmic electrode 600 may be formed. The schottky electrode 500 may be in contact with the p+ area 400 and the n− type epitaxial layer 300.

Hereinafter, characteristics of an SBD according to an exemplary embodiment of the present inventive concept and a conventional SBD will be described in detail with reference to FIG. 8.

Figure 8:
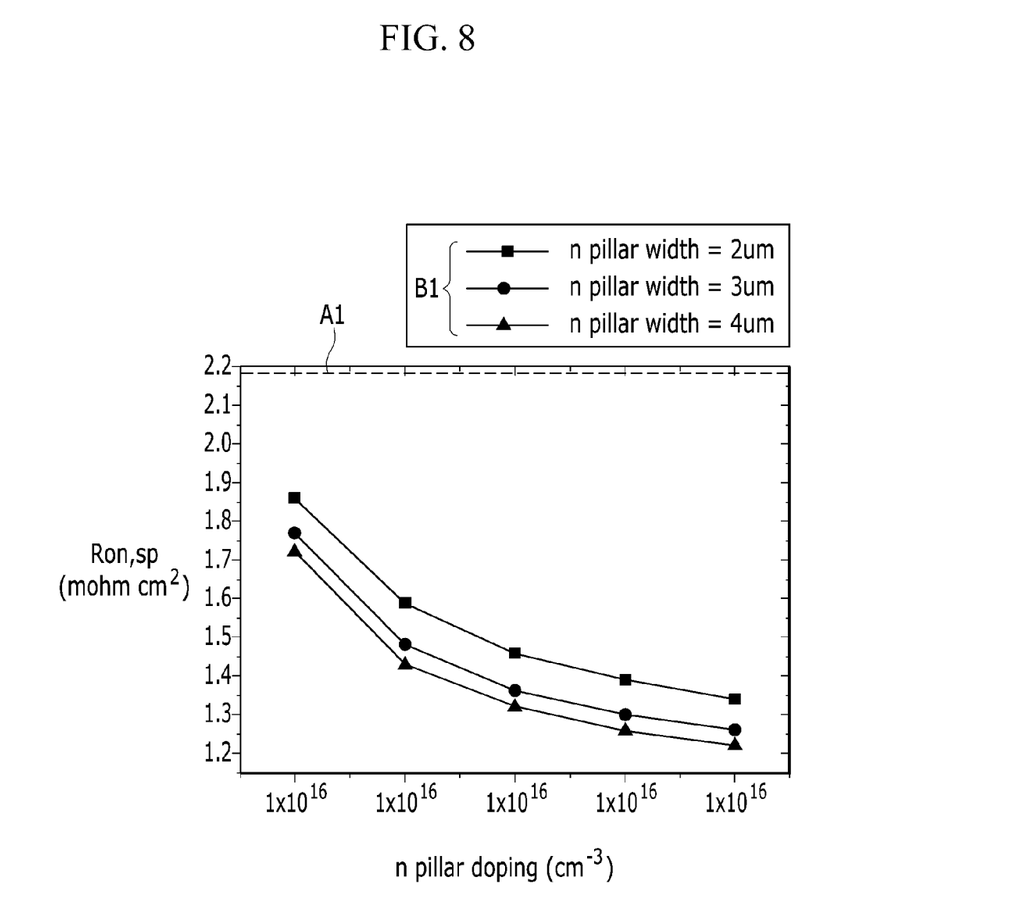
FIG. 8 is a graph comparing on-resistance of a schottky barrier diode according to an exemplary embodiment of the present inventive concept and a conventional schottky barrier diode.
Figure 9:
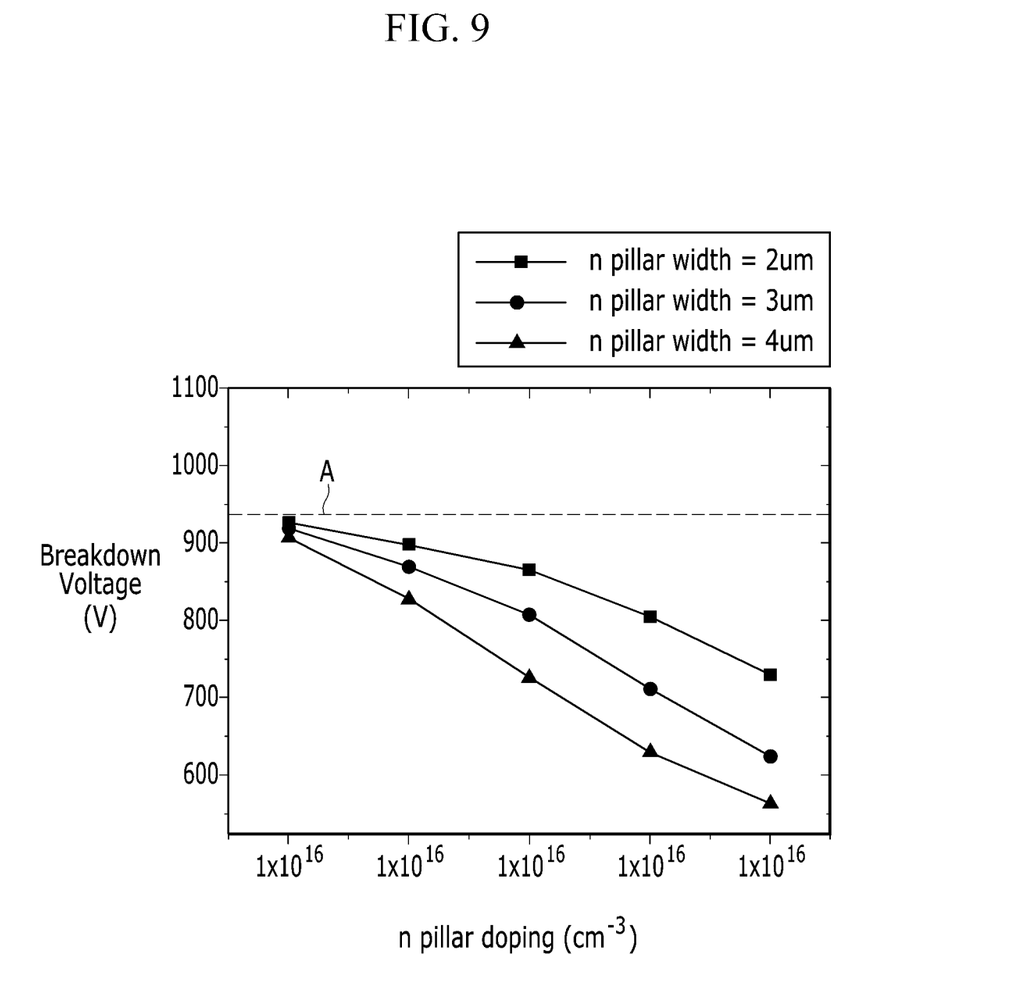
FIG. 9 is a graph comparing breakdown voltage of a schottky barrier diode according to an exemplary embodiment of the present inventive concept and a conventional schottky barrier diode.
Figure 10:
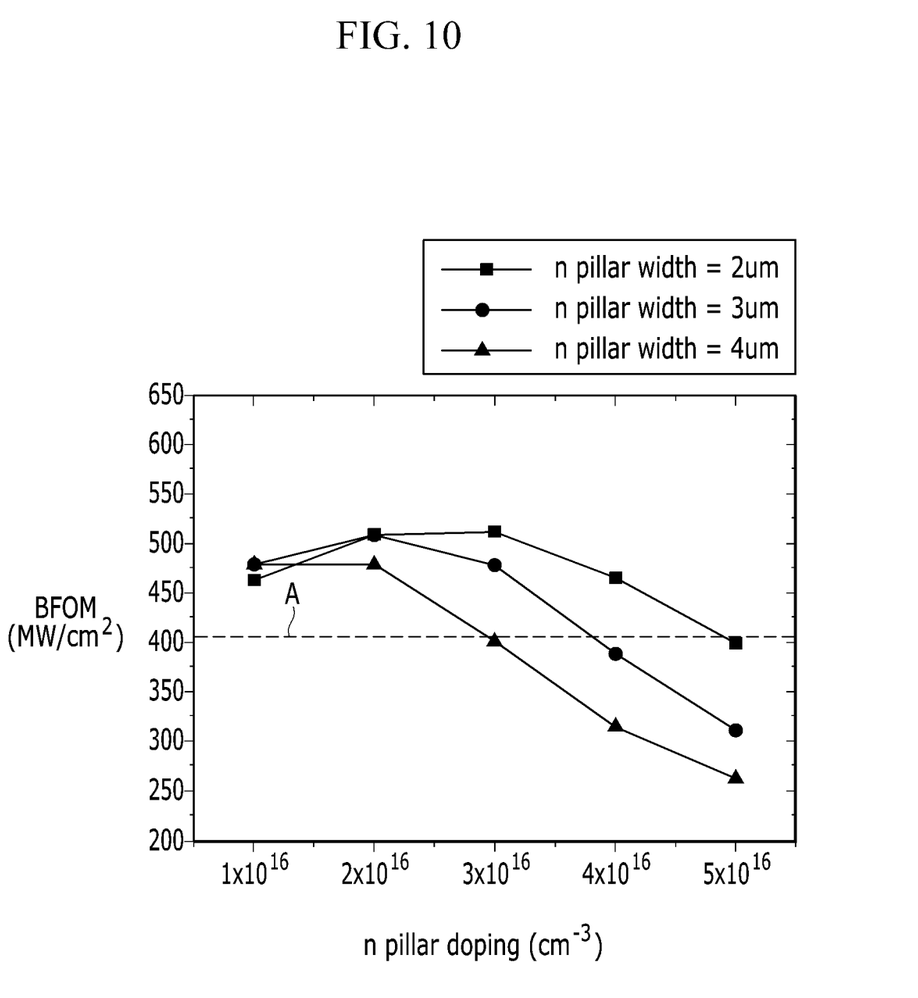
FIG. 10 is a graph comparing BFOM of a schottky barrier diode according to an exemplary embodiment of the present inventive concept and a conventional schottky barrier diode.

In FIG. 8, A1 indicates a characteristic of an SBD that applies a structure of the conventional junction barrier schottky (JBS), and B1 indicates a characteristic of an SBD according to an exemplary embodiment of the present inventive concept.

FIG. 8 is a graph comparing on-resistance of an SBD according to an exemplary embodiment of the present inventive concept and a conventional SBD.

Referring to FIG. 8, it can be seen that on-resistance of the SBD according to an exemplary embodiment of the present inventive concept is reduced, compared with on-resistance of the conventional SBD. Further, as a doping concentration of an n pillar area increases and as a width of an n pillar area increases, it can be seen that on-resistance of the SBD reduces due to an influence of the n pillar area.

<Description of symbols>

| | |
|---|---|
| 50: first buffer layer pattern | 60: second buffer layer pattern |
| 100: n+ type silicon carbide substrate | 200: n type pillar area |
| 300: n− type epitaxial layer | 310: preliminary n− type epitaxial layer |
| 400: p+ area | 500: schottky metal |
| 600: ohmic metal | |

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A schottky barrier diode, comprising:
   an n− type epitaxial layer disposed at a first surface of an n+ type silicon carbide substrate;
   a plurality of n type pillar areas disposed in the n− type epitaxial layer at a first portion of the first surface of the n+ type silicon carbide substrate;
   a plurality of p+ areas disposed at a surface of the n− type epitaxial layer and separated from the n type pillar area;
   a schottky electrode disposed on the n− type epitaxial layer and the p+ area; and
   an ohmic electrode disposed at a second surface of the n+ type silicon carbide substrate,
   wherein a doping density of the n type pillar area is larger than a doping density of the n− type epitaxial layer,
   wherein the plurality of p+ areas are disposed between the schottky electrode and an extension line of an upper surface of the n type pillar area, and
   wherein the plurality of n type pillar areas are disposed directly on the first surface of the n+ type silicon carbide substrate.

2. The schottky barrier diode of claim 1, wherein the p+ area is disposed at a portion corresponding to a second portion of the first surface of the n+ type silicon carbide substrate adjacent to the first portion of the first surface of the n+ type silicon carbide substrate.

3. The schottky barrier diode of claim 2, wherein the p+ area is disposed at a corresponding portion between the n type pillar areas.

* * * * *